(12) United States Patent
Risher-Kelly

(10) Patent No.: US 7,974,090 B2
(45) Date of Patent: Jul. 5, 2011

(54) PORTABLE MEDICAL DEVICE COOLING SYSTEM

(75) Inventor: Clifford Risher-Kelly, Wells, ME (US)

(73) Assignee: Draeger Medical Systems, Inc., Andover, MA (US)

( * ) Notice: Subject to any disclaimer, the term of this patent is extended or adjusted under 35 U.S.C. 154(b) by 0 days.

(21) Appl. No.: 12/447,589

(22) PCT Filed: Nov. 9, 2007

(86) PCT No.: PCT/US2007/084202
§ 371 (c)(1),
(2), (4) Date: Apr. 28, 2009

(87) PCT Pub. No.: WO2008/058266
PCT Pub. Date: May 15, 2008

(65) Prior Publication Data
US 2010/0008036 A1    Jan. 14, 2010

(51) Int. Cl.
*G06F 1/20* (2006.01)
*H05K 7/20* (2006.01)
*F25B 21/02* (2006.01)

(52) U.S. Cl. ......... 361/679.47; 361/679.46; 361/679.54; 361/690; 361/704; 361/715; 165/185; 62/3.2; 62/3.3; 62/3.7; 62/259.2; 700/300

(58) Field of Classification Search . 361/679.47–679.48, 679.52, 679.54–679.55, 361/690, 694–695, 697, 702–704, 709, 714–715; 165/80.2–80.3, 185; 62/3.2, 3.3, 3.7, 259.2; 700/300
See application file for complete search history.

(56) References Cited

U.S. PATENT DOCUMENTS

| | | | | |
|---|---|---|---|---|
| 4,812,733 A * | 3/1989 | Tobey | | 323/285 |
| 5,731,954 A * | 3/1998 | Cheon | | 361/699 |
| 5,987,890 A * | 11/1999 | Chiu et al. | | 62/3.2 |
| 6,084,769 A | 7/2000 | Moore et al. | | |
| 6,109,039 A | 8/2000 | Hougham et al. | | |
| 6,191,943 B1 * | 2/2001 | Tracy | | 361/679.46 |
| 6,362,959 B2 * | 3/2002 | Tracy | | 361/679.47 |
| 6,415,612 B1 * | 7/2002 | Pokharna et al. | | 62/3.2 |
| 6,646,874 B2 * | 11/2003 | Pokharna et al. | | 361/679.09 |
| 6,659,815 B2 * | 12/2003 | Motsenbocker | | 440/1 |
| 6,837,057 B2 * | 1/2005 | Pokharna et al. | | 62/3.2 |
| 7,082,772 B2 * | 8/2006 | Welch | | 62/3.2 |
| 2002/0181201 A1 | 12/2002 | Liu et al. | | |
| 2004/0130870 A1 * | 7/2004 | Fleck et al. | | 361/687 |
| 2004/0179332 A1 | 9/2004 | Smith et al. | | |
| 2005/0174737 A1 * | 8/2005 | Meir | | 361/697 |
| 2006/0232929 A1 | 10/2006 | Huang et al. | | |

* cited by examiner

*Primary Examiner* — Robert J Hoffberg
(74) *Attorney, Agent, or Firm* — Jack Schwartz & Associates, PLLC

(57) ABSTRACT

A cooling system cools an electrically rechargeable portable device accommodated in a docking station. The cooling system includes a docking station having a non-forced air active cooling unit and a housing. The cooling unit maintains a first heatsink surface at a temperature below an ambient temperature and a second heatsink surface at a temperature exceeding said first heatsink surface temperature. The housing accommodates an electrically re-chargeable portable device. The housing re-charges said portable device and seats said portable device in a position providing thermal contact between said docking station first heatsink surface and a heat spreader of said portable device while re-charging of said portable device.

21 Claims, 3 Drawing Sheets

US 7,974,090 B2

PORTABLE MEDICAL DEVICE COOLING SYSTEM

FIELD OF THE INVENTION

The present invention relates generally to the field of portable electronic devices, and more particularly to battery powered devices that are susceptible to elevated temperatures caused by the battery recharging process.

BACKGROUND OF THE INVENTION

A problem with existing portable medical devices, and their associated docking stations used for recharging the batteries within the medical devices, is that the portable devices may become hot during the charging process. Some portable medical devices may be placed in direct contact with a patient during use, either intentionally or accidentally. If an excessive surface temperature exists on a fully or recently charged portable device, use of the device may cause discomfort or potentially even burn a patient when the device is attached to the patient. Many known portable medical devices become so warm after recharging that a warning label is needed to prohibit skin contact for some period of time after charging is completed.

The problem of heat generation during the charging process is often exacerbated by the fluid and shock resistant structure in which portable medical devices are housed. For example, an international protocol for waterproof equipment housings that is sometimes applied to portable medical devices is the IPX7 standard. A device having an IPX7 certification must be able to withstand accidental immersion in one meter of water for thirty minutes. An IPX7 cabinet or housing may have heat insulation properties which tend to retain any heat generated by internal circuitry when charging a battery.

A system constructed according to the principles of the present invention addresses these deficiencies.

BRIEF SUMMARY OF THE INVENTION

In accordance with principles of the present invention, a cooling system cools an electrically rechargeable portable device accommodated in a docking station. The cooling system includes a docking station having a non-forced air active cooling unit and a housing. The cooling unit maintains a first heatsink surface at a temperature below an ambient temperature and a second heatsink surface at a temperature exceeding said first heatsink surface temperature. The housing accommodates an electrically re-chargeable portable device. The housing re-charges said portable device and seats said portable device in a position providing thermal contact between said docking station first heatsink surface and a heat spreader of said portable device while re-charging of said portable device.

DETAILED DESCRIPTION OF THE INVENTION

Figure 1:
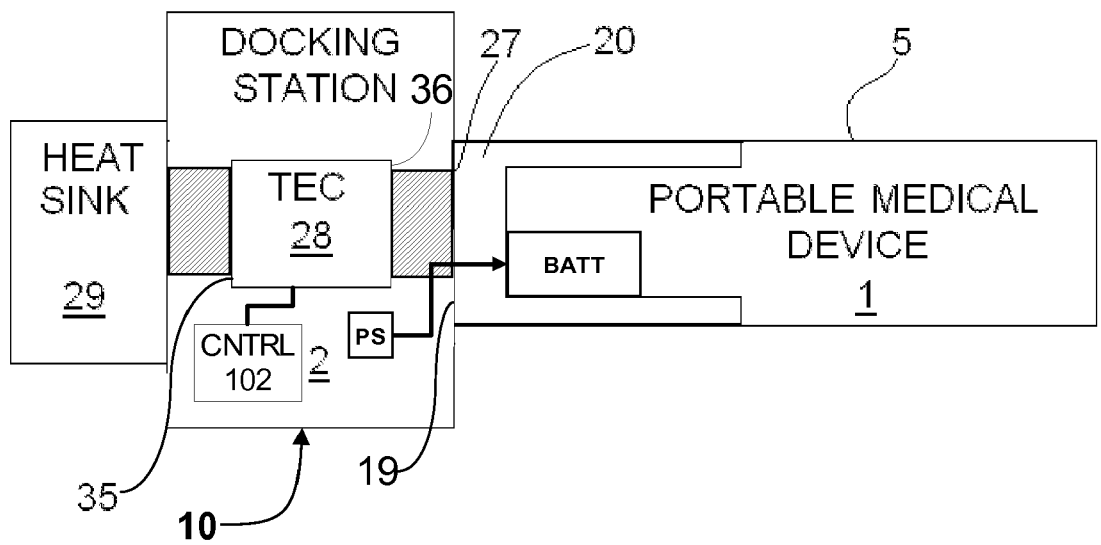
FIG. 1 is a schematic diagram of a cooling system in accordance with principles of the present invention.

FIG. 1 is a schematic diagram of a cooling system in accordance with principles of the present invention. FIG. 1 illustrates a cooling system for use in a docking station 2 which accommodates an electrically re-chargeable portable device 1 for cooling the portable device 1. The docking station 2 is adapted to receive a portable electronic device 1 having a surface which may come in contact with human skin and containing at least one rechargeable battery.

The docking station 2 includes a non-forced air active cooling unit 28 for maintaining a first heatsink surface 27 at a temperature below an ambient temperature and for maintaining a second heatsink surface 29 at a temperature exceeding the first heatsink surface 27 temperature. The active cooling unit 28 includes a heat conductive path, shown in crosshatch, between a first surface or plate 36 of the active cooling unit 28 and the first heat sink surface 27, and an other heat conductive path, shown in crosshatch, between the second surface or plate 35 of the active cooling unit 28 and the heatsink 29. These heat conductive paths may be fabricated from materials having a relatively high thermal conductivity, such as silver, copper, gold, aluminum, etc. Alternatively, other heat conducting paths, such as heat pipes, may be used.

The active cooling unit 28 is adapted to transfer heat appearing at the first heatsink surface 27 to an ambient atmosphere via the second heatsink surface 29. The first heatsink surface 27 is adapted to abut the portable electronic device 1 whenever the portable electronic device 1 is fully seated within the docking station 2. A housing 10 accommodates the electrically re-chargeable portable device 1 for re-charging the portable device 1 and seating the portable device 1 in a position providing thermal contact between the docking station first heatsink surface 27 and a heat spreader 20 surface 19 of the portable device 1 while re-charging of the portable device 1.

The particular means for re-charging the portable device 1 is not germane to the present invention, and is illustrated schematically in FIG. 1 by a power supply PS in the docking station 2 coupled to a battery BATT in the portable device 1. The battery BATT in the portable device 1 is intended to represent both a battery and any circuitry required in the portable device 1 to recharge it.

A heat sink 29 is thermally coupled to the second surface 35 of the active cooling unit 28, as described above, and operates to dissipate heat from the second surface 35 to the surrounding air at the ambient temperature. Because the active cooling unit 28 maintains the second heatsink surface 29 at a temperature higher than the ambient temperature, and a heat sink is more efficient when the temperature difference between the hot surface and the surrounding ambient air is relatively large, a fan is not typically required for further cooling.

In one embodiment, the non-forced air active cooling unit 28 is a thermoelectric cooling (TEC) device, such as a Peltier device, formed to include a first plate 35 and a second plate 36, the second plate 36 being relatively cooler than the first plate 35. However, in other embodiments, the non-forced air cooling unit may be: (a) a heat pipe, (b) a heat pump, and/or (c) an air conditioner. Although described above as being a non-forced air cooling unit, the second heatsink surface 29 may be further cooled by forced air cooling as well. More specifically, a fan may be used to increase heat dissipation from the second heatsink surface 29 to the surrounding air at ambient temperature. In either event, the second heatsink surface 29 may be formed to include a plurality of fins to increase the surface area and passively dissipate heat into an ambient atmosphere. The finned heatsink surface 29 is placed in thermal contact with the relatively warm plate 35 of the thermoelectric cooler 28, as described above, and the heatsink surface 29 is passively cooled.

The portable device 1 includes electronic circuitry and/or components which generate heat. In particular, this circuitry generates heat when the battery BATT is being charged by the power supply PS. The portable device 1 includes a heat spreader 20 which is designed to carry heat away from the battery BATT and the associated charging circuitry to a surface 19 during charging. When docked in the docking station 2, the surface 19 of the portable device 1 is thermally connected to the plate 36 of the active cooling unit 28 through the first heatsink surface 27, as described above. Because the surface 36 of the active cooling unit 28 is maintained at a relatively low temperature, i.e. below the ambient temperature, heat flows from the heat spreader 20 to the active cooling unit 28 through surfaces 27 and 19 and 36. This heat then is transferred to the heat sink 29 through the surface 35 of the active cooling unit 28, as described above, where it is dissipated to the surrounding air.

The temperature difference maintained by the active cooling unit 28 between surface 27 and the heatsink 29 depends on the power applied to the active cooling unit 28. A controller 102 varies the power applied to the active cooling unit 28 to vary the degree of cooling employed. For example, the controller 102 may vary the power applied to the active cooling unit 28 in response to a mode of operation of the portable device 1. The controller 102 may also vary the power applied to the active cooling unit 28 in response to: (a) the temperature of the portable device 1, (b) the temperature of the first heatsink surface 27, and/or the ambient temperature. The controller 102 may further be adapted to vary the power supplied to the thermoelectric cooler in response to a charging rate of the rechargeable battery BATT. By controlling the active cooling unit 28 in this manner, the outside surface 19 of the portable device 1 is maintained at a temperature which is insufficient to cause discomfort to human skin if the surface 19 comes in physical contact with human skin.

In operation, the portable device 1 is placed in the docking station 2. That is, the surface 19 of the portable device 1 is placed into an abutting relationship with the first heatsink surface 27 of the active cooling unit 28. In one mode of operation, a temperature within the portable device 1 is sensed and the cooling rate of the thermoelectric cooler 28 residing within the docking station 2 is adjusted so as to substantially maintain a desired temperature within the portable device 1.

As described above, the present invention finds particular application with a portable medical device for receiving and processing patient medical parameter data. However, the portable device 1 may also be at least one of (a) a laptop or notebook computer, (b) a phone, and/or (c) an appliance. Any portable device which may be recharged by being placed into a docking station, and which produces heat during the recharge process may be used with the cooling system described above with respect to FIG. 1.

Figure 2:
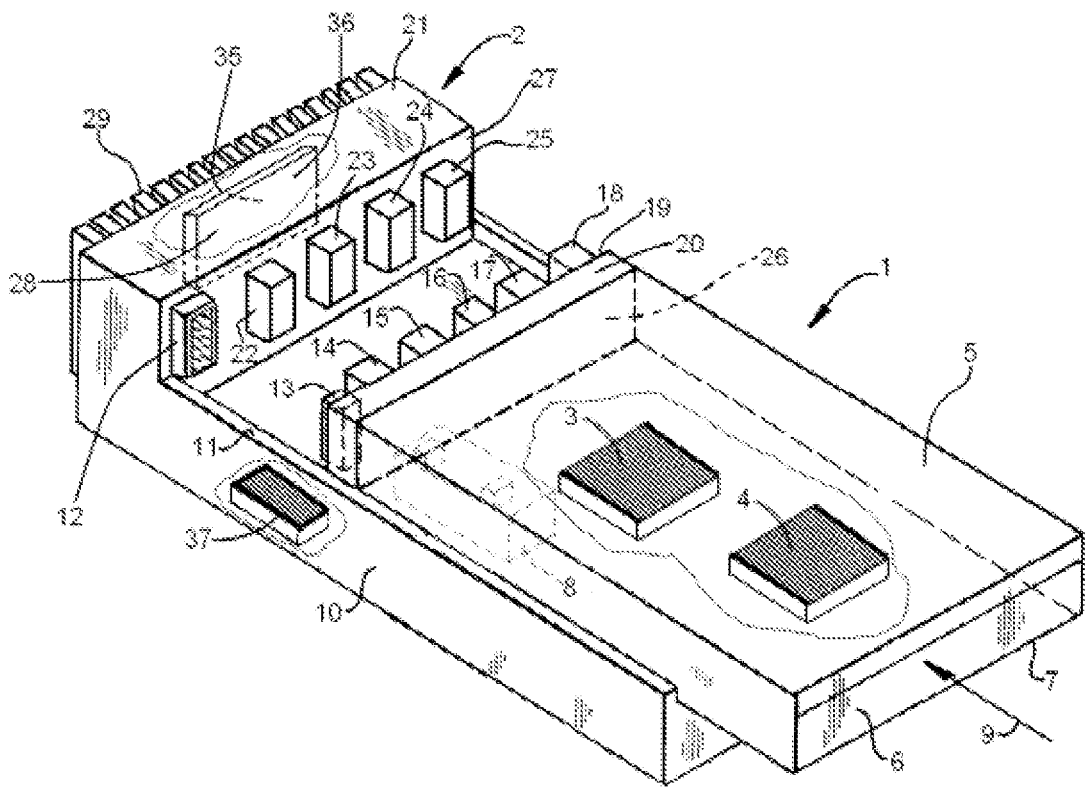
FIG. 2 is a more detailed perspective view, with some surface portions broken away, of a cooling system constructed according to principles of the present invention.

FIG. 2 is a more detailed perspective view, with some surface portions broken away, of a cooling system constructed according to the principles of the present invention. In FIG. 2, device 1 is a portable medical device, such as a portable patient monitor and/or treatment device. The device 1 is inserted into the docking station 2 by moving the device 1 in the direction of arrow 9. The docking station 2 is formed, for example, to include a housing 10 that terminates at an edge 11. The housing 10 is suitably dimensioned to guide and retain the device 1 within the docking station 2. A plug 12 is formed within the docking station 2 in order to supply electrical power to, and to exchange data signals with, the medical device 1. The plug 12 is suitably positioned to mate with and electrically interconnect to a socket 13 mounted on the portable medical device 1.

The socket 13 is electrically interconnected to an internal battery recharging circuit 8 (shown in phantom) mounted within the device 1 which supplies the actual recharging current to the batteries 3 and 4. Alternatively, the electronic components that comprise the recharging circuit 8 may reside within the docking station 2. The chemical composition, placement, dimensions and number of batteries 3 and 4 may vary according to the particular type of portable medical device 1, but typically the batteries 3 and 4 are capable of generating a substantial amount of heat during the battery charging process. The internal battery recharging circuit 8, mounted within the medical device 1, generates an additional quantity of heat.

Depending on the mounting configuration of the battery recharging circuit 8 and the batteries 3 and 4, the heat generated by each battery 3, 4 and the recharging circuit 8 is transferred in some manner to the surface 5 of the portable medical device 1. The particular geometry of the battery 3, 4 and recharging circuit 8 mounting scheme used in the medical device 1 may cause heat to be transferred more efficiently or less efficiently to the end surface 6 and the edges 7 of the device 1. At least some surfaces such as surfaces 5 and 6, for example, may be composed of, enclosed in, or coated with a plastic, rubber or other inherently heat insulating material which is required for purposes such as water proofing and shock resistance. The net result of the internal heat generation of the batteries 3, 4 and the recharging circuit 8, in combination with the heat insulating properties of the medical device 1, is poor heat dissipation and high surface temperatures on at least some exposed surfaces of the medical device 1.

In order to increase the heat dissipating mass and surface area of the portable medical device 1, the device 1 further includes at least one heat conducting strip and a heat conducting mass. The heat conducting strip extends from a heat producing component, such as the recharging circuit 8 or batteries 3,4, mounted within the portable device 1 and extends to the heat conducting mass. A series of extensions, such as extensions 14, 15, 16, 17 and 18 are formed on an external surface 19 of the device 1. The extensions 14, 15, 16, 17 and 18 are situated to mate with corresponding extensions 22, 23, 24 and 25 on the docking station 2. The surface 19 resides on a heat conducting mass or heat spreader 20 that forms a portion of the medical device 1. Additional heat conducting strips or other such elements may extend from the heat spreader 20 to the recharging circuit 8 or batteries 3 and 4 to more efficiently transfer the heat generated by those components to the heat spreader 20.

Figure 3:
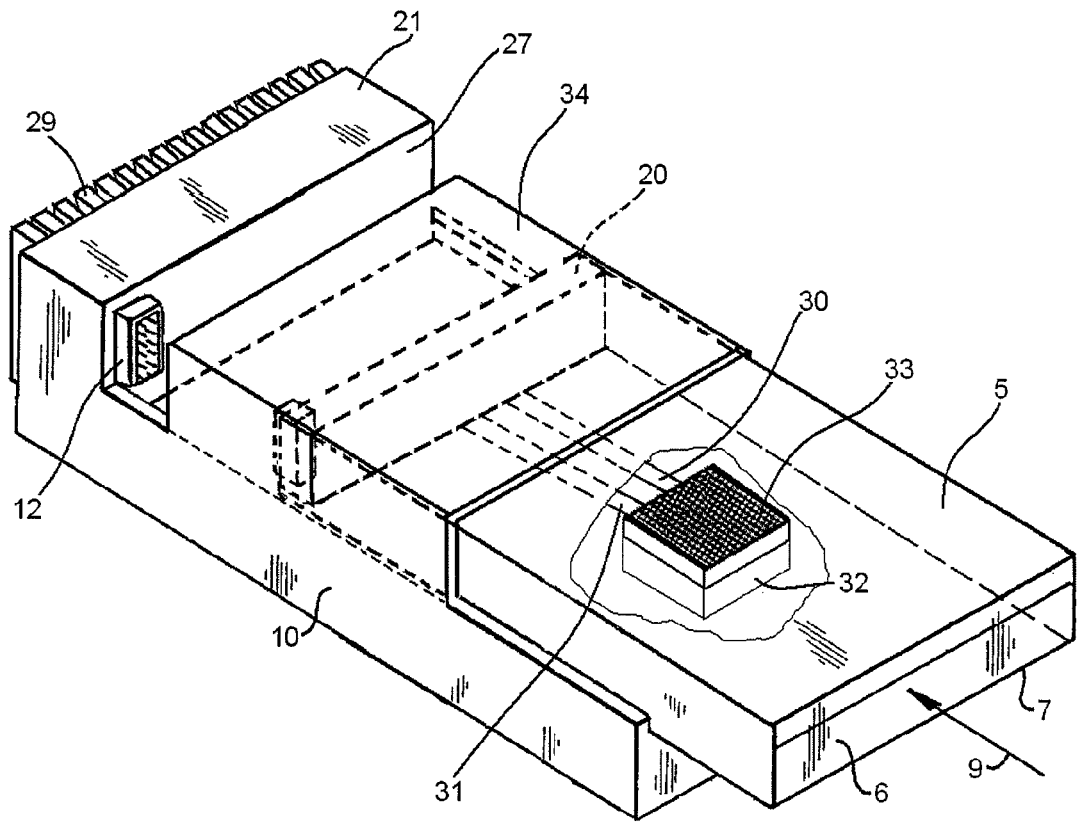
FIG. 3 is a perspective view of a second embodiment of a portable device cooling system constructed according to principles of the present invention.

In the alternate embodiment depicted in FIG. 3, the movement of air within the medical device 1 or the relative mass of the heat spreader 20 may be sufficient to transfer excess heat to the heat spreader 20 from the heat generating components of the portable medical device 1 without the need for additional external heat conducting elements. However, at least some heat conducting elements such as heat conducting strips 30 and 31, for example, which extend directly to the mounting region 32 of some heat producing component 33 within the portable medical device 1 to the heat spreader 20, are typically used to facilitate heat conduction. In FIG. 3, the heat conducting mass 20 has a substantially planar surface which is adapted to abut the first heatsink surface 27.

Referring again to FIG. 2, the docking station 2 is formed to include a heatsink 21 which is formed to include the plurality of abutments 22, 23, 24 and 25 which are suitably positioned to abut and/or interlace with the extensions 14, 15, 16, 17 and 18 extending from the medical device 1. Typically both abutments 22-25 and extensions 14-18 are formed of a metallic or other heat conductive material such that surface contact between the abutments and the heat spreaders causes the efficient transfer of heat from one surface to another. In an alternate embodiment of the invention, the extensions 14-18 may be mounted on the internal surface 26 of heat spreader 20, thereby extending into the interior of the device 1. In such an arrangement the abutments 22-25 are omitted, and the substantially planar surface 19 of heat spreader 20 abuts directly with the substantially planar surface 27 of the heatsink 21, as is the case with the structure shown in FIG. 3.

In the embodiment of FIG. 3, the extensions 14-18 may be omitted because the heat conducting strips 30 and 31 of the docking station 2 are sufficient to transfer the heat from the heat producing component 33 of device 1 to the heat spreader 20. In FIG. 3, the housing 10 of the docking station 2 is extended so as to reach the top surface 5 of the device 1, and an additional top plate 34 which abuts the top surface 5 is also employed to increase both the mass and the surface area of heat conducting material which is available to transfer heat from the heat spreader 20.

In each embodiment of the present invention the heat spreader 20 and the heatsink 21 may be encased in some type of plastic or other protective material which is nonetheless capable of transferring heat between the heat spreader 20 and the heatsink 21. In each embodiment, in order to extract heat from the portable medical device 1, the docking station 2 preferably incorporates some means to maintain the temperature of the heatsink 21 below the surface temperature of the heat spreader 20 and thus below the temperature of any external surface of the medical device 1. Ideally, the temperature of the heatsink 21 will be maintained below the ambient room temperature. Forced air convection by itself may be applied to cool the heatsink 21 but using this technique, it is not possible to achieve a heatsink 21 temperature that is less than the ambient room temperature.

Referring again to FIG. 2, in order to maintain the heatsink 21 at the desired below-room-temperature value, an active cooling device such as thermoelectric cooler (TEC) 28 is used. The TEC 28 resides between and is thermally interconnected to the first planar heatsink surface 27 of heatsink 21 and a second finned heatsink surface 29. When power is applied to the TEC 28, the TEC maintains a difference between the first plate 35 and the second plate 36. The TEC 28 acts to cool the second plate 36 with respect to the first plate 35, thereby cooling the planar surface 27 and transferring heat to the finned heatsink 29 where the excess heat may be dissipated into the ambient atmospheric air. The magnitude of the heat difference between the second plate 36 and the first plate 35 is proportional to the amount of electrical power supplied to the TEC 28 by power and control module 37. The control module 37 is electrically interconnected to the battery recharging circuit 8. The control module 37 operates in response to the temperature of some portion or component of the portable device 1, the temperature of the first heatsink surface 27 or the ambient atmospheric temperature.

For example, during periods of high power consumption by the battery recharging circuit 8 which would correspond to a mode of relatively high heat generation, the control module 37 supplies a relatively large amount of power to the TEC 28, thereby causing a relatively large temperature difference between the first plate 35 and the second plate 36. During periods of lower power consumption by the battery recharging circuit 8, which would correspond to a mode of relatively lower heat generation by the batteries 3 and 4 as well the recharging circuit 8, the control module 37 supplies a relatively lower amount of power to TEC 28, thereby causing a relatively smaller temperature difference between the first plate 35 and the second plate 36. While in one embodiment the active cooling unit is a TEC 28, the active cooling unit may comprise devices other than a particular Peltier effect thermoelectric cooler. Other acceptable active cooling units may include a heat pump, air conditioner or other non-forced air device that maintains the first heatsink surface 27 below ambient air temperature and the second heatsink surface 29 at or above ambient air temperature.

The thermodynamic relationships of the device 1 and docking station 2 as depicted in FIGS. 2 and 3 are best appreciated with reference back to FIG. 1. The heat generating components, e.g. battery BATT, of the portable medical device 1 are in thermal contact with the heat spreader 20 which has a surface 19 which abuts the first heatsink surface 27. The second plate or surface 36 of TEC 28 is in thermal contact with the first heatsink surface 27, either through direct physical abutment, as illustrated, or via some other thermal path such as a heat pipe. The first plate or surface 35 of the TEC 28 is in thermal contact with finned heatsink surface 29.

When TEC 28 is in typical operation the first surface 35 has a temperature of approximately 38 degrees Celsius (100 degrees Fahrenheit), while the second surface 36 has a temperature of approximately −2 degrees Celsius (28 degrees Fahrenheit). The finned heatsink 29 is able to dissipate the heat corresponding to the 38° C. temperature without the need of a fan or other forced air assistance. Consequently, in some circumstances the heatsink 29 may be reduced in size. In cases where the placement of the heatsink 29 dictates an even more limited physical size, forced air cooling may be used to assist the heat dissipation function of the heatsink. The TEC 28 maintains the lower −2° C. temperature at the heat spreader 20, causing the adjoining temperature of the portable device surface 5 to achieve a value that is relatively cool to human skin.

Figure 4:
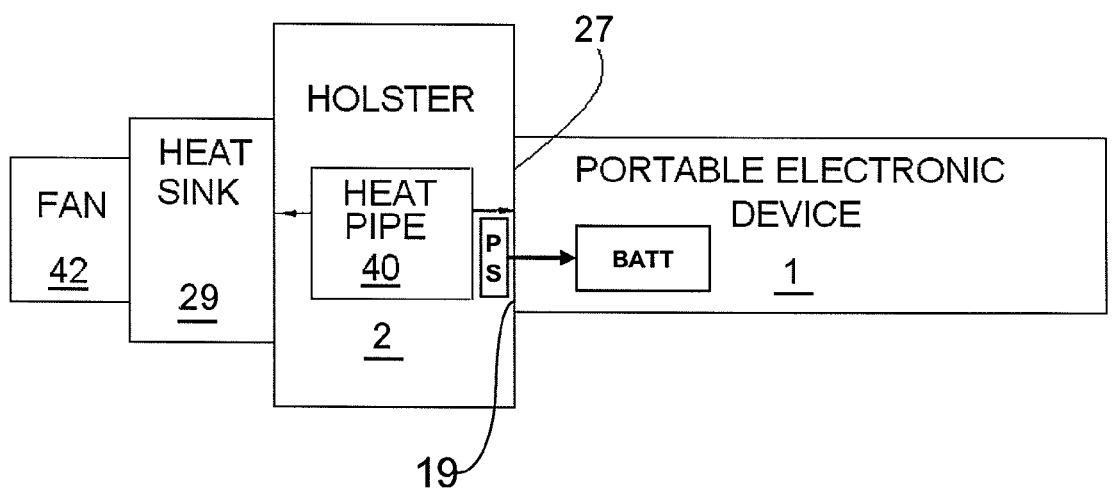
FIG. 4 is a schematic diagram illustrating the thermal characteristics of a third alternate embodiment of a portable device cooling system constructed in accordance with principles of the present invention.
Figure 5:
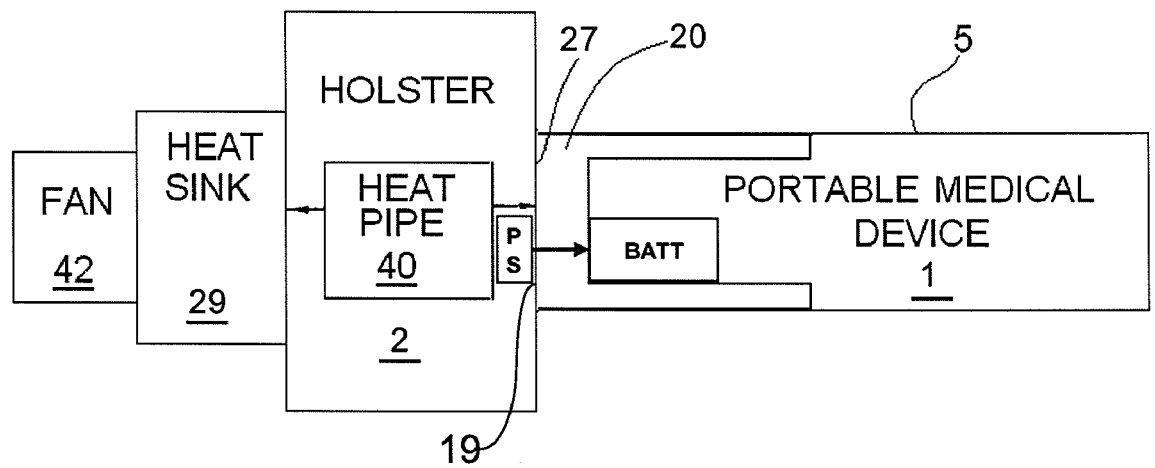
FIG. 5 is a schematic diagram illustrating the thermal characteristics of a fourth alternate embodiment of a portable device cooling system constructed in accordance with principles of the present invention.

While a particular form and use of the present invention has been described above, the invention is not limited to the specific arrangement of parts or manner of use described. For example, FIG. 4 depicts a portable electronic device 1 which, for example, is housed in a docking station 2 which is a wall mounted holster during recharging. In this embodiment, one or more Perkins type heat pipes 40 may be used to more efficiently transfer heat from the device surface 19 to the heatsink 29. The heat pipe 40 is typically a small diameter tube filled with a coolant which travels via capillary action through small grooves formed within the interior of the tube. As battery recharging progresses, the temperature of the device surface 19 elevates, and a heat pipe 40 transfers some of the generated heat from the surface 27 of the holster 2 to the heatsink 29. Forced air provided by fan 42 cools the heatsink 29. FIG. 5 depicts a similar arrangement but with the addition of heat spreader 20. The heat spreader block 20 may be similar to the heat spreader block 20 described above, and serves the similar function of adding to the efficiency of heat transfer from internal heat producing regions of the portable device 1 to the device surface 19 where further cooling takes place via heat pipe 40 and heatsink 29.

One skilled in the art understands that in situations where the ambient temperature in which the present system is used is relatively low, the TEC 28 may instead function as a heating unit to maintain the temperature of the portable medical device 1 above a specified minimum value. Other modifications to the construction and use of the present system may be made without departing from the scope of the invention.

Although the invention has been described in terms of exemplary embodiments, it is not limited thereto. Rather, the appended claims should be construed broadly to include other variants and embodiments of the invention which may be made by those skilled in the art without departing from the scope and range of equivalents of the invention. This disclosure is intended to cover any adaptations or variations of the embodiments discussed herein.

What is claimed is:

1. A system for cooling an electrically re-chargeable portable medical device for use in a docking station for accommodating said electrically re-chargeable portable medical device, comprising:
   the docking station including,
   a non-forced air active cooling unit for maintaining a first heatsink surface at a temperature below an ambient temperature and for having a second heatsink surface at a temperature exceeding said first heatsink surface temperature,
   a housing for accommodating an electrically re-chargeable portable medical device for re-charging said portable medical device and seating said portable medical device in a position providing thermal contact between said docking station first heatsink surface and a heat spreader of said portable device during re-charging of said portable device and said housing prevents said second heatsink surface from contacting said portable medical device, and
   a controller for varying a temperature difference between said first heatsink surface and said second heatsink surface based on a sensed temperature based on power consumption during re-charging of the electrically rechargeable portable device and causing the second heatsink surface to directly dissipate heat into the air surrounding the docking station away from said portable medical device.

2. A system according to claim 1, wherein said non-forced air active cooling unit comprises a thermoelectric cooling device.

3. A system according to claim 1, wherein said non-forced air active cooling unit comprises at least one of, (a) a heat pipe and (b) a heat pump.

4. A system according to claim 1, wherein said portable medical device comprises a medical device for receiving and processing patient medical parameter data.

5. A system according to claim 1, wherein said second heatsink surface is cooled by forced air cooling.

6. A system according to claim 1, wherein said controller varies power applied to said active cooling unit in response to a power level of said portable medical device.

7. A system according to claim 6, wherein said controller varies power applied to said active cooling unit in response to a mode of operation of said portable medical device.

8. A system according to claim 6, wherein said controller varies power applied to said active cooling unit in response to at least one of, (a) a temperature of said portable medical device, (b) a temperature of said first heatsink surface and (c) an ambient temperature.

9. A system according to claim 8, wherein the portable medical device further comprises an exterior device surface formed of a particular type of material, and said controller dissipates the heat resulting in a temperature of the exterior device surface being of a level insufficient to cause discomfort to human skin when the exterior device surface is in physical contact with human skin, said level being in accordance with standard temperature levels associated with the particular type of material forming the exterior device surface.

10. A system according to claim 9, further comprising:
    at least one heat conducting strip; and
    a heat conducting mass, the heat conducting strip extending from a heat producing component mounted within the portable medical device and extending to the heat conducting mass.

11. The system according to claim 10, wherein the heat conducting mass further comprises a substantially planar heat conducting mass surface, the substantially planar heat conducting mass surface being adapted to abut the first heatsink surface.

12. A system according to claim 1, wherein the second heatsink surface is finned.

13. The docking station of claim 1, wherein said first heatsink surface includes a plurality of abutments for mating with a corresponding plurality of abutments on the heat spreader of said portable medical device.

14. The docking station of claim 13, wherein said plurality of abutments maximize a surface area of contact for mating with the plurality of corresponding abutments the heat spreader of on said portable medical device.

15. A docking station adapted to receive a portable electronic medical device, the portable electronic medical device having a surface which may come in contact with human skin and the portable electronic medical device containing at least one rechargeable battery, said docking station comprising:
    a first heatsink surface, the first heatsink surface adapted to abut the portable electronic medical device whenever the portable electronic medical device is fully seated within the docking station;
    a second heatsink surface, the second heatsink surface not in contact with said portable electronic medical device;
    an active cooling unit, the active cooling unit being adapted to directly transfer heat appearing at the first heatsink surface to an ambient atmosphere surrounding the docking station and away from the portable electronic medical device via the second heatsink surface; and
    a controller for varying a temperature difference between said first heatsink surface and said second heatsink surface based on a sensed temperature based on power consumption during recharging re-charging of the electrically rechargeable portable electronic medical device.

16. The docking station of claim 15, wherein the second heatsink surface is formed to include a plurality of fins adapted to passively dissipate heat into the ambient atmosphere.

17. The docking station of claim 16 wherein the active cooling unit is a thermoelectric cooler formed to include a first plate and a second plate, the second plate being relatively cooler than the first plate.

18. The docking station of claim 17, wherein said controller is adapted to vary power supplied to the thermoelectric cooler in response to a charging rate of the at least one rechargeable battery.

19. The docking station of claim 15, wherein said first heatsink surface includes a plurality of abutments for mating with a corresponding plurality of abutments on a heat spreader of said portable medical device.

20. The docking station of claim 19, wherein said plurality of abutments maximize a surface area of contact for mating with the plurality of corresponding abutments on the heat spreader of said portable medical device.

21. A method of cooling a portable medical device, comprising the steps of:
   placing the portable medical device within a docking station;
   sensing a temperature based on power consumption of the portable medical device during recharging of the portable medical device;
   varying a temperature difference between a first heatsink surface and a second heatsink surface based on the sensed temperature of the portable medical device during re-charging, wherein the first heatsink surface being in thermal contact with the portable medical device and the second heatsink surface being prevented from contacting the portable medical device; and
   adjusting a cooling rate of a thermoelectric cooler positioned between the first heatsink surface and the second heatsink surface, and residing within the docking station so as to maintain a desired temperature within the portable medical device and directly dissipating heat from the second heatsink surface into an atmosphere surrounding the docking station away from said portable medical device.

* * * * *